United States Patent [19]

Khan

[11] 4,406,716

[45] Sep. 27, 1983

[54] PROCESS FOR INCREASING THE LIFETIME OF A REFRACTORY MATERIAL PIECE MADE OF METALLIC CARBIDE PARALLEL FIBERS EMBEDDED INTO A METALLIC MATRIX

[75] Inventor: Tasadduq Khan, Jouy en Josas, France

[73] Assignee: Office National d'Etudes et de Recherches Aerospatiales (O.N.E.R.A.), Chatillon Sous Bagneux, France

[21] Appl. No.: 235,948

[22] Filed: Feb. 19, 1981

[30] Foreign Application Priority Data

Feb. 28, 1980 [FR] France ............................. 80 04488

[51] Int. Cl.³ ........................... C21D 9/00; C22F 1/10
[52] U.S. Cl. ..................................... 148/130; 148/404
[58] Field of Search .............. 148/158, 162, 142, 130, 148/32, 32.5, 404; 75/170, 171

[56] References Cited

U.S. PATENT DOCUMENTS 3,871,835  3/1975  Bibring et al. ..................... 75/170
3,985,582  10/1976  Bibring et al. ..................... 148/162

FOREIGN PATENT DOCUMENTS 2239537  2/1975  France .
2291285  6/1976  France .

*Primary Examiner*—R. Dean
*Attorney, Agent, or Firm*—Karl F. Ross; Herbert Dubno

[57] ABSTRACT

The invention relates to a process for increasing the lifetime of a refractory composite material piece comprising a metallic matrix and a reinforcing phase consisting of aligned monocrystalline fibers made of a metallic carbide, when the piece has suffered a plastic deformation in the direction of said fibers. The invention consists in restoring the initial qualities of the piece by subjecting it to a high temperature, inferior to the melting point of the material, more precisely at the temperature at which the piece resumes its initial length after being cooled at ambient temperature. The invention is particularly applicable to pieces forming turbine blades for aircrafts.

7 Claims, 1 Drawing Figure

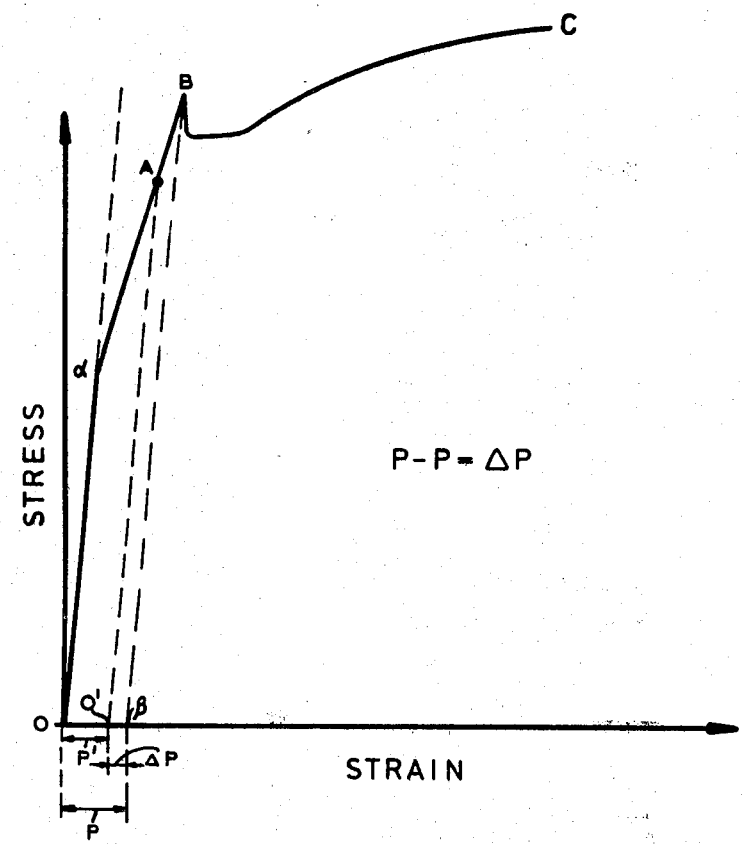

PROCESS FOR INCREASING THE LIFETIME OF A REFRACTORY MATERIAL PIECE MADE OF METALLIC CARBIDE PARALLEL FIBERS EMBEDDED INTO A METALLIC MATRIX

FIELD OF THE INVENTION

The object of the present invention is a process for increasing the lifetime of a piece in a refractory material made of a metallic matrix with metallic carbide parallel fibers.

Refractory composite materials comprising a metallic matrix in which are embedded metallic carbide monocrystalline parallel fibers, or whiskers, the already known.

Such materials, described in the U.S. Pat. Nos. 3,871,835 and 4,043,841 and Patent application Ser. No. 93,118 of the present applicant, comprise a matrix made of a nickel-and/or iron-and/or cobalt-based superalloy, in which is present a reinforcing phase in the form of parallel monocrystalline fibers or whiskers, made of transition metal monocarbides of groups IV and V of the Periodic Table, such as TaC, NbC, TiC, HfC, VC or ZrC, either of one only of said monocarbides, or as a solid solution of two or three of said carbides. Examples of the ponderal composition of such materials which proved particularly advantageous are the following:

| Cr | 10–20% | Cr | 10–20% |
|----|--------|----|--------|
| Co | 0–30 | Ni | 0–30 |
| Al | 0–6 | Ta | 0–14 |
| Ta | 0–18 | Nb | 0–9 |
| Nb | 0–9% | C | 0.7–1% |
| C | 0.4–0.9 | Co | to total 100% |
| Ni | to total 100% | | |
| Cr | 6–15% | Co | 0–20% |
| Co | 20–30 | W | 7–14 |
| W | 7–10 | Al | 4–7 |
| Al | 3–6 | Cr | ≦10 |
| Nb | 4–6 | Nb | 3.5–6 |
| Ni | to total 100% | C | 0.35–0.65 |
| | | Ni | to total 100% |

Parts of such materials are obtained by molding and unidirectional solidification under conditions providing the formation within the matrix of long monocrystalline and parallel fibers.

In such materials whose complex matrix is nickel-based, said matrix can be hardened through precipitation of a coherent $\gamma'$ phase of the $Ni_3Al$ type, as well as by the presence of tungsten and eventually molybdeum in a solid solution.

Such materials exhibit exceptionally high qualities as regards their mechanical characteristics, such as their tensile strength, their behavior to creep, and their structural stability, and they are particularly adapted for forming parts subjected, in service, to severe stresses at a high temperature, as is the case for the movable blades of gas turbines used in aviation.

However, it is known that such movable blades, after a long time of service, show modifications of their characteristics, particularly an increase of their length due to a permanent deformation of the matrix and a degradation of some mechanical properties such as for example a limitation of their plastic deformation capacity.

OBJECTS AND SUMMARY OF THE INVENTION

The object of the invention is the treatment of pieces made of composite materials comprising a metallic matrix and a reinforcing phase made of monocarbide parallel fibers, or whiskers, produced by unidirectional solidification, for restoring said pieces to their initial qualities after a use which has subjected them to mechanical stresses as well as to sudden and repeated temperature variations.

The treatment according to the invention allows increasing considerably the duration of use of such parts.

The treatment according to the invention is characterized in that such a worn-out piece is heated, in principle in the absence of a mechanical stress, to a high temperature, but lower than the melting point of the constituent alloy. Preferably, the piece is placed in an argon atmosphere.

The piece is then cooled to ambient temperature without particular precautions, for example by letting the oven containing the treated piece cool down or by removing the piece from the oven for cooling it in the ambient air.

It has been found that, surprisingly, after such a treatment, the result is a piece exhibiting the same qualities as a new piece, namely than a part obtained directly by unidirectional solidification and so far not used.

In the composite materials with a metallic matrix and parallel monocrystalline fibers of the hereabove mentioned type, the respective thermal expansion coefficients of the fibers and the matrix are very different, —that of the fibers being much lower than that of the matrix—, the difference being of the order of $10^{-5}/°C$.

The result is that during the initial stage of the production, the differential expansion of the fibers and of the matrix is the cause, during cooling of the material, of inner stresses appearing in the fibers and in the matrix. At ambient temperature, the fibers are set under compression, usually between 2000 and 4000 MPa, embedded in a matrix which is under tension. In the absence of an outer stress, there is a mechanical equilibrium between the fibers and the matrix at any temperature.

During use, such a piece is essentially subjected to tension stresses in the direction of the fibers, simultaneously or not with an increase of temperature, and, in the normal conditions of use, it is frequent that the matrix elasticity limit is exceeded so that the piece is subjected to a permanent plastic deformation, the fibers being of course always within their elasticity range.

As a matter of fact, it is this progressive plastic deformation of the matrix which, during a prolonged use, brings about an elongation of the piece which makes it unusable after a duration which it would be desirable to increase.

It is precisely by taking advantage of what, hitherto, could be considered as a disadvantage, that the invention results in a treatment which practically restores the initial qualities to the piece.

In a piece having been subjected to a limited plastic deformation insufficient for rupturing the fibers, the strain level of the fibers and of the matrix is modified since the matrix alone has been plastically deformed. In this deformed state, the compression residual elastic deformation of the fibers is not as pronounced as in the non deformed state.

If such a deformed piece is heated at a temperature sufficiently high, the fibers will expand much less than the matrix and the system will tend towards an inner strain state of equilibrium, close to that which was existing at that same temperature when producing the part.

The simple fact of bringing back thereafter next the piece at the ambient temperature reestablishes the conditions of strain in equilibrium of the starting piece, said piece shrinking in length due to the elasticity of the fibers and recovering its geometrical configuration and its original deformation capacity.

Thus, the treatment improves the creep and tensile properties of pieces already used by applying the elastic properties of the reinforcing phase formed by the monocrystalline fibers, taking advantage of the inner strain state existing in materials of such type.

The maximum treatment temperature depends on the mechanical strength of the matrix.

In the case of cobalt-based composites, stabilized by additions of nickel, the temperature of 1100° C. is sufficient for the recovery of the dimensions and mechanical properties.

In a nickel-based composite containing $\gamma'$ precipitates, it is preferable to heat the material to the temperature where the $\gamma'$ precipates are set in solution, which is from 1100° C. to 1250° C. according to the composites.

Maintaining the piece for a few minutes, of the order of 15 to 30 minutes, at the maximum temperature is sufficient for restoring the dimensions to the piece.

A subsequent heating at a temperature of 750°–850° C. provides again the homogeneous precipitation of the $\gamma'$ precipitates, and allows restoring the mechanical properties of the alloy.

BRIEF DESCRIPTION OF THE DRAWING

The sole FIGURE in this case is a diagram where strain is plotted against stress.

DETAILED DESCRIPTION OF THE EMBODIMENTS

In the following description, given by way of example, reference is made to the accompanying drawing wherein the single FIGURE is a diagram.

A piece made of a composite material comprising a metallic matrix, for example a nickel-based superalloy, and a reinforcing phase consisting in very fine monocrystalline elongated fibers, or whiskers, obtained by unidirectional solidification, is, when used, deformed in the direction of the fibers length, by going further than the elastic limit of the matrix but without reaching the breaking point of the fibers. The piece is thus deformed permanently but its fibers work within their elastic range practically up to their breaking point. After use, a piece, which can be a test-piece, has lost part of its plastic deformation capacity, as is shown in the FIGURE which is a diagram where the test-piece deformation is plotted against the Y-axis and the tensile stress which is applied to the test-piece is plotted against the X-axis.

The portion $O\alpha$ of the diagram corresponds to the elastic deformation, in the matrix as well as in the fibers. From point $\alpha$, the matrix is plastically deformed, the section of curve $\alpha B$ which follows representing the plastic deformation of the matrix and the elastic deformation of the fibers. The latter remain plastic practically until the beginning of their breaking which occurs when the stress reaches a value equal to the ordinate of point B. The curve BC corresponds to the deformation of the material once the fibers are broken, point C corresponding to the breaking of the material.

If, during use or during a test, the piece is deformed up to a condition corresponding to point A of the diagram, which is between $\alpha$ and B, there remains, once the stress is removed, a permanent deformation of the piece represented by the length of segment OO′, O′ being the intersection of the straight line AO′, parallel to the straight line $O\alpha$ with the X-axis.

The permanent maximum deformation of the material before breaking of the fibers is shown by the length of segment $O\beta,\beta$ being the intersection of the X-axis with the straight line $B\beta$ parallel to $O\alpha$. This deformation or deformation capacity of the material is usually of the order of 1 to 1.5% for the materials under consideration.

If, after a first tensile test which has brought the piece to a condition symbolized by O′, a new tensile test is being carried out, the plastic deformation which the matrix will be able to support is no more symbolized by $O\beta$, as for the initial piece, but by $O'\beta$, the length of which is notably shorter.

EXAMPLE 1

Test-pieces have been manufactured, through unidirectional solidifaction, from a cobalt-based alloy having the following nominal composition (in % by weight):

Cr 20
Ni 10
Ta 13.2
C 0.78
Co to total 100%

A first test-piece has been subjected to a tensile test at 25° C. until breaking. The breaking load was of 1030 MPa and the plastic elongation for the breaking point of the fibers of 0.92%.

An identical test-piece was subjected to a tensile test which caused its plastic elongation up to 0.8%. For such an elongation, there was no breaking of the fibers.

The test-piece which had been subjected to a plastic deformation of 0.8% was, according to the invention, treated for a few minutes at 1100° C. in an argon atmosphere, then cooled. The treated test-piece had recovered the length of the virgin test-piece; a tensile test at 25° C. carried out up to the breaking of the fibers gave the following results:

Load corresponding to the breaking of the fibers: 1020 MPa.

Elongation at the breaking point of the fibers: 0.92%.

The treated test-piece thus exhibits the same qualities as the virgin specimen, in spite of having been plastically deformed during its lifetime.

EXAMPLE 2

Test-pieces are produced by unidirectional solidification of a nickel-based alloy having the following composition (in % by weight):

Co 10
Cr 4
W 10
Mo 2
Al 6
Nb 3.8
C 0.47
Ni to total 100%

The test-pieces are made of a nickel-based superalloy matrix in which are embedded monocrystalline fibers or whiskers. On the other hand, the matrix is hardened by a $\gamma'$ ($Ni_3Al$) precipitate.

A first test-piece was subjected to a tensile test up to breaking at 1000° C. Its breaking load was of the order of 520±10 MPa and its plastic elongation capacity at breaking point of the fibers is of about 1.2%.

An identical test-piece was subjected to a tensile test in order to elongate it to 1.3% at 25° C. During the test, the fibers did not break, but were subjected to a purely elastic deformation.

their creep properties when they have been deformed up to the maximum admissible elongation.

These treatments therefore allow increasing considerably the lifetime of the blades.

| Test conditions | | Length measurements of test pieces (mm) | | | | | Duration (hours) (lifetime) | |
|---|---|---|---|---|---|---|---|---|
| | | Initial length | After | After thermal | After | After thermal | Cumulated | Non interrupted |
| Temperature (°C.) | stress (MPa) | before creep | 1st creep | treatment (1200 + 850) | 2nd creep | treatment (1200 + 850) | creep duration | test durations |
| 850 | 400 | 30.02 | 30.40 | 30.06 | 30.42 | 30.10 | 1040 | 700 |
| 900 | 310 | 29.98 | 30.36 | 30.08 | 30.35 | 30.08 | 1303 | 700 |
| 1000 | 220 | 30.00 | 30.36 | 30.06 | | | 302* | 200 |

*A single intermediate thermal treatment

The test-piece thus tested, or second test-piece, was subjected to a breaking tensile test at 1000° C. as the first test-piece. Its breaking load was of 520 MPa, substantially identical to the first test-piece, but its plastic elongation capacity up to the breaking of the fibers was about 0.33%, therefore substantially lower than that of the first test-piece.

A test-piece identical to the second test-piece, viz. having been subjected to a permanent deformation at 25° C. of the order of 1.3% was, according to the invention, heated at 1200° C. in an argon atmosphere for 30 minutes and then cooled in air.

After having been cooled down in air, the test-piece was heated again to a temperature of 850° C. and maintained at said temperature for about 15 hours.

The treated test-piece was subjected to a tensile test at 1000° C. until breaking of the fibers. The breaking load was of about 520 MPa and the plastic elongation at the breaking point of the fibers of the order of 1.2%, namely with values identical to those of the virgin test-piece.

The treatment at 1200° C. brought back the test-piece to its initial length, and the treatment at 850° C. allowed reestablishing the homogeneous precipitation of the γ' (Ni₃Al) phase present in the virgin test-piece.

EXAMPLE 3

The same test-pieces as the virgin test-pieces of Example 2 were used. Said test-pieces were subjected to creep tests, some of them at 850° C., and some others at 900° C. and 1000° C. After having been cooled back to ambient temperature, the test-pieces exhibited a permanent deformation of the order of 1.2–1.3%. The thus deformed test-pieces were treated according to the invention by heating them at 1200° C. for 30 minutes, then by cooling them in air. They were then heated again to 850° C. for 16 hours.

All the test-pieces have practically recovered their initial lengths as measured before the creep test.

The herebelow table shows that the thermal treatment and restoration cycles (1200° C./30 mn+850° C./16 h) which had been carried out substantially increase the creep lifetimes of the alloy relative to the uninterrupted creep lifetimes.

The thermal treatments according to the invention are of particular interest for the movable blades of turbines.

Whereas the movable blades of turbines of some aviation engines are considered as unusable after an elongation of about 1 to 2%, the thermal treatments according to the invention restore the length of said blades and

I claim:

1. A process for reconditioning a unidirectionally reinforced worn out turbine blade wherein
    (a) the turbine blade is originally formed by unidirectional solidification of a refractory composite material comprising a nickel and/or iron and/or cobalt-based superalloy matrix and a reinforcing phase consisting of aligned monocrystalline fibers made of a transition metal monocarbide of the groups IV and V, said composite material having at room temperature an internal state of stress such that the fibers are in compression and embedded in a matrix under tension; and
    (b) the turbine blade has been exposed in use to limited permanent plastic deformation of 1 to 1.5 percent in the direction of the fibers with the fibers remaining in their elasticity range; the reconditioning process comprising the steps of:
        (i) in order to restore the initial length of the turbine blade, heating the worn-out turbine blade without external mechanical stress to a temperature of at most 1250° C. and sufficiently high to bring the turbine blade to a state of stress between the fibers and the matrix close to the state of stress that existed at the same temperature during formation of the turbine blade in step (a) but sufficiently low to prevent any degradation of the fibers or the matrix; and
        (ii) subsequently cooling the treated turbine blade to enable the fibers to recover their initial length due to their non-modified elasticity, the turbine blade thus recovering the desired state of stress and its initial length.

2. The process defined in claim 1 wherein the matrix is cobalt-based and the fibers are tantalum carbide, and the deformed turbine blade is heated to a temperature of about 1100° C.

3. The process defined in claim 2, wherein the turbine blade is kept at said temperature for about 30 minutes.

4. The process defined in claim 1 wherein the matrix is nickel-based and the monocrystalline fibers are niobium monocarbide and the turbine blade is heated to a temperature between 1150° and 1250° C.

5. The process defined in claim 4 wherein the turbine blade is kept at said temperature for about 30 minutes.

6. The process defined in claim 3 wherein the matrix contains a γ' (Ni₃Al) precipitate, the turbine blade is heated, after the treatment for reestablishing its dimension, at a temperature to allow a new precipitation of the γ' phase.

7. The process defined in claim 6 wherein the turbine blade is heated at about 850° C. for about fifteen hours.

* * * * *